United States Patent
Rhoades

(10) Patent No.: US 6,454,367 B1
(45) Date of Patent: Sep. 24, 2002

(54) APPARATUS FOR PROCESSING WORKPIECES

(75) Inventor: Charles Stephen Rhoades, Diablo, CA (US)

(73) Assignee: Trikon Equipments Limited, Newport (GB)

( * ) Notice: Subject to any disclaimer, the term of this patent is extended or adjusted under 35 U.S.C. 154(b) by 0 days.

(21) Appl. No.: 09/446,432

(22) PCT Filed: Jun. 25, 1998

(86) PCT No.: PCT/GB98/01859

§ 371 (c)(1),
(2), (4) Date: Jan. 2, 2001

(87) PCT Pub. No.: WO99/00827

PCT Pub. Date: Jan. 7, 1999

(30) Foreign Application Priority Data

Jun. 26, 1997 (GB) .............................................. 9713390

(51) Int. Cl.[7] .............................................. B65G 1/04
(52) U.S. Cl. ...................................................... 312/198
(58) Field of Search .......................... 312/1, 198, 199, 312/211

(56) References Cited

U.S. PATENT DOCUMENTS

| | | | |
|---|---|---|---|
| 3,675,563 A | | 7/1972 | Metreaud |
| 4,544,318 A | | 10/1985 | Nagatomo et al. |
| 4,825,808 A | | 5/1989 | Takahashi et al. |
| 5,535,306 A | * | 7/1996 | Stevens ........................ 395/89 |
| 5,695,564 A | * | 12/1997 | Imahashi ..................... 118/719 |
| 5,838,121 A | * | 11/1998 | Fairbairn et al. ............. 318/45 |
| 6,062,798 A | * | 5/2000 | Muka .......................... 414/416 |

* cited by examiner

Primary Examiner—Janet M. Wilkens
(74) Attorney, Agent, or Firm—Volentine Francos, PLLC

(57) ABSTRACT

Radial cluster tools, for example, include a central load/unload station and processing chambers for processing workpieces, such as semiconductor wafers. The processing chambers are arranged about the central load/unload station in abutting pairs to leave substantial maintenance spaces.

12 Claims, 3 Drawing Sheets

APPARATUS FOR PROCESSING WORKPIECES

BACKGROUND OF THE INVENTION

This invention relates to apparatus for processing workpieces (for example semi-conductor wafers) and in particular, but not exclusively, to radial cluster tools.

When manufacturing a semi-conductor device on a semi-conductor wafer, it is common to need to process the wafer with successive processes, such as etching and deposition processes, in a common controlled environment, for example under vacuum. It has long been appreciated that considerable savings can be achieved in production time and cost if the chambers can be arranged around a central wafer load/unload station, which itself is kept at the controlled environment, so that the wafers can be passed from chamber to chamber without the need for a vacuum break or the like. Commonly the chambers are arranged so that the wafer transport axis intersect at a common point and such an arrangement is known as a radial cluster tool. One example of such a tool is illustrated in U.S. Pat. No. 5,308,431.

From time to time the processing chambers will require maintenance, for example the replacement of sputtering targets or shielding. In order to allow access for that maintenance, standard SEMI E26-92 of the Trade Body Semiconductor Equipment and Materials International lays down unoccupied or restricted areas which must exist between the footprint of each module or processing chamber. This significantly limits the number of processing chambers, which can be arranged around a load/unload station of particular cross section.

SUMMARY OF THE INVENTION

From one aspect the present invention consists in apparatus for processing workpieces in a controlled environment comprising a central workpiece load/unload station having a plurality of processing chambers arranged around the load/unload station so that the workpieces can be moved from one processing chamber to another without leaving the controlled environment, characterised in that:

inlets/outlets of the chambers are radially arranged around the load/unload station;

at least two of the chambers are arranged as an abutting pair; and maintenance access is provided to each said chamber through its respective non-abutting side and wherein the chamber is substantially fully accessible for maintenance through that access.

In a preferred embodiment the chambers of the pair abut completely. This unequal distribution of chambers enables maintenance access gaps to be provided between pairs and the apparatus includes chambers wherein maintenance access is provided to each chamber through its respective non-abutting side. The chambers are arranged to be substantially fully accessible for maintenance through that access.

It is further preferred that the footprint of each abutting pair and/or the intervening spaces is generally rectangular.

Conveniently, with a normal cross sectional dimension of the loading/unloading station, 6 to 8 processing chambers can be included in the apparatus, the chambers being arranged in pairs.

Preferably the apparatus is in a form of a radial cluster tool in which case the workpiece transport axes may be equally disposed around their point of intersection.

Preferably, a process position of each said processing chamber lies on a circle about a point of intersection of transfer paths to the chambers from the load/unload station.

Although the invention has been defined above, it is to be understood it includes any inventive combination of the features set out above or in the following description.

BRIEF DESCRIPTION OF THE DRAWING

The invention can be performed in various ways and specific embodiments will now be described by way of example with reference to the accompanying drawings in which.

DETAILED DESCRIPTION OF THE PREFERRED EMBODIMENTS

Figure 1:
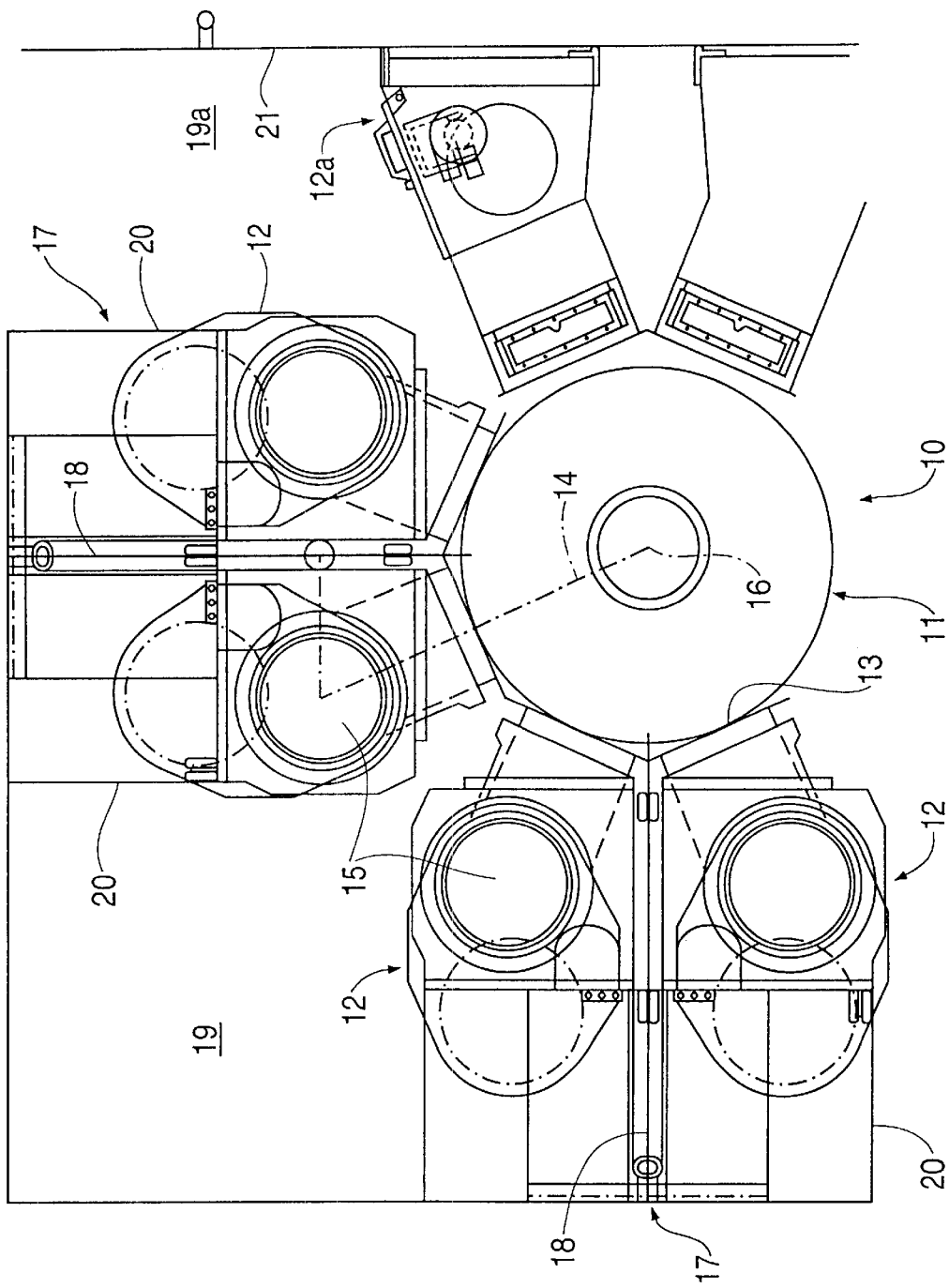
FIG. 1 is a plan view of processing apparatus according to an embodiment of the present invention.

A radial cluster tool is generally illustrated at 10, and comprises a central loading/unloading station 11, processing chambers 12 and vacuum load lock/cassette elevators 12a. Load locks 12a provide communication through the clean room wall 21.

The load/unload station 11 includes a wafer or other workpiece transfer mechanism (not shown), for example of the type illustrated and described in U.S. Pat. No. 5,308,431. This is arranged to load and unload workpieces through the respective gate valves 13 into the processing chambers 12 along transfer paths, such as illustrated at 14. It will be noted that the process position, 15, of each chamber 12 lies on a circle about the point of intersection of the transfer paths 14. In this sense the layout is entirely conventional.

However, by configuring the processing chambers 12 in rectangular modules, it is possible to arrange them in pairs 17 so that their adjacent walls 18 are abutted. In this way the pairs 17 have a very compact rectangular footprint and the result is that substantial maintenance spaces 19 are provided between the abutting pairs 17. The arrangement is particularly advantageous in that it allows a maintenance space 19a adjacent the clean wall 21, which is simply not available with a radial configuration. Each processing chamber 12 is formed with an access along its wall 20, which opens onto the maintenance space 18 and the chambers 12 are configured so that all necessary maintenance can be achieved through that access.

Figure 2:
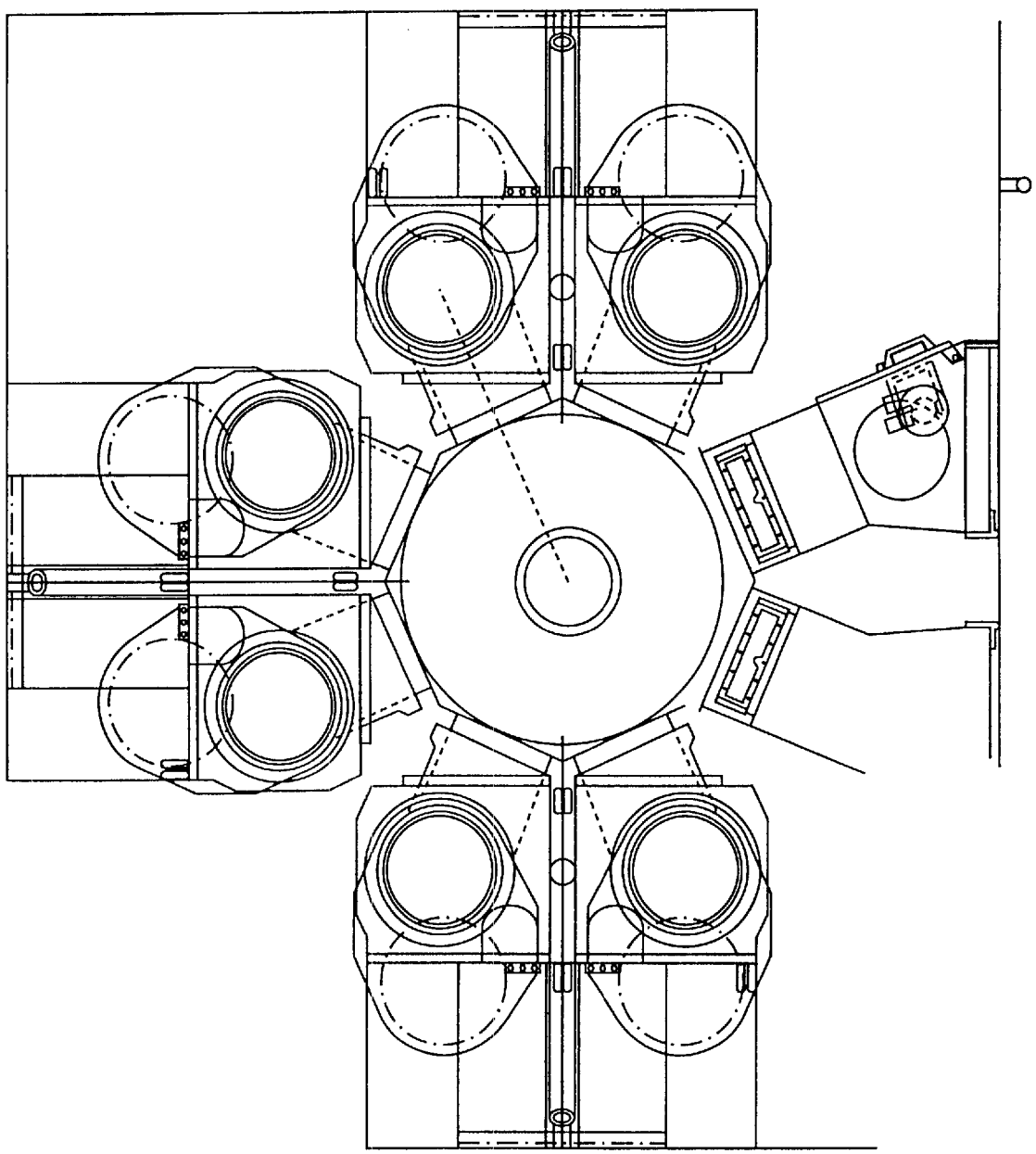
FIG. 2 illustrates an example of an embodiment of the present invention having six processing chambers.
Figure 3:
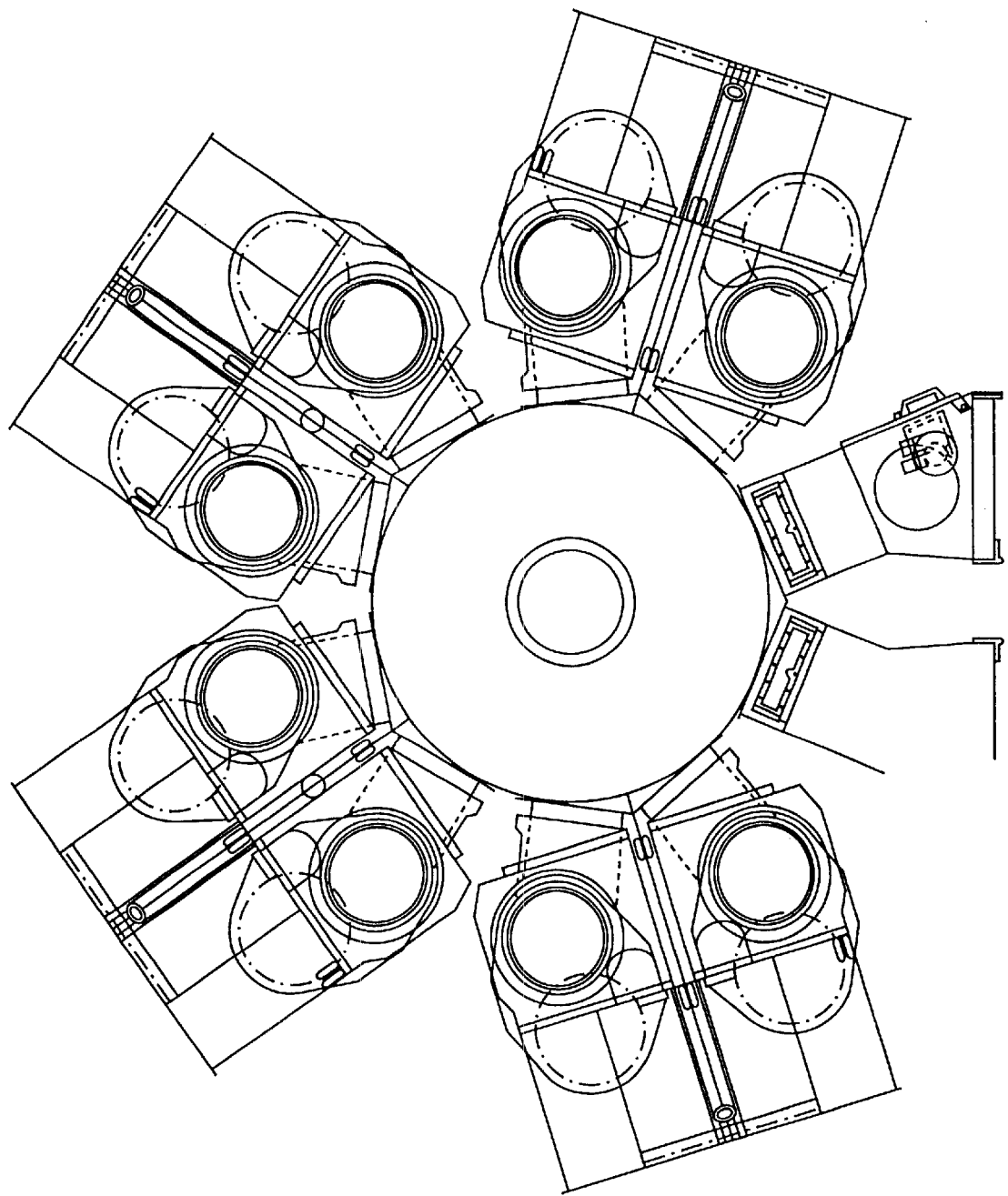
FIG. 3 illustrates an example of an embodiment of the present invention having eight processing chambers.

In the previous arrangement, the lack of maintenance space tended to limit the number of chambers. According to the present invention as shown by way of example in FIG. 2, the same chamber dimensions for six chambers (three pairs) can readily be accommodated, whilst providing a good maintenance access. FIG. 3 shows another exemplary arrangement having eight (four pairs) processing chambers.

What is claimed is:

1. Apparatus for processing workpieces in a controlled environment comprising a central workpiece load/unload station having a plurality of processing chambers arranged around the load/unload station so that the workpieces can be moved from one processing chamber to another without leaving the controlled environment, characterised in that:

inlets/outlets of the chambers are radially arranged around the load/unload station;

at least two of the chambers are arranged as an abutting pair; and maintenance access is provided to each said chamber through its respective non-abutting side and wherein the chamber is substantially fully accessible for maintenance through that access.

2. Apparatus as claimed in claim 1 wherein there is a plurality of abutting pairs.

3. Apparatus as claimed in claim 2 wherein the footprint of each abutting pair is generally rectangular.

4. Apparatus as claimed in claim 2 including 6 or 8 processing chambers arranged in pairs.

5. Apparatus as claimed in claim 2 wherein the apparatus is a radial cluster tool.

6. Apparatus as claimed in claim 1 wherein the footprint of each abutting pair is generally rectangular.

7. Apparatus as claimed in claim 6 including 6 or 8 processing chambers arranged in pairs.

8. Apparatus as claimed in claim 6 wherein the apparatus is a radial cluster tool.

9. Apparatus as claimed in any one of the claim 1 including 6 or 8 processing chambers arranged in pairs.

10. Apparatus as claimed in claim 9 wherein the apparatus is a radial cluster tool.

11. Apparatus as claimed in claim 10 wherein a process position of each said processing chamber lies on a circle about a point of intersection of transfer paths to the chambers from the load/unload station.

12. Apparatus as claimed in claim 9 wherein the apparatus is a radial cluster tool.

\* \* \* \* \*